United States Patent [19]
MacGregor et al.

[11] Patent Number: 6,101,096
[45] Date of Patent: Aug. 8, 2000

[54] HEAT SINK CLIP FOR AN ELECTRONIC ASSEMBLY

[75] Inventors: Mike MacGregor, Olympia; Michael T. Crocker, Tacomoa; Thomas Wong, Seattle; Peter Davison, Sumner, all of Wash.; Rolf A. Konstad, Gold River; David A. Jones, El Dorado Hills, both of Calif.

[73] Assignee: Intel Corporation, Santa Clara, Calif.

[21] Appl. No.: 09/330,242

[22] Filed: Jun. 10, 1999

[51] Int. Cl.$^7$ ...................................................... H05K 7/20
[52] U.S. Cl. ........................ 361/720; 361/704; 361/707; 361/694; 361/695; 165/80.3; 165/185; 165/104.34; 174/16.3; 174/16.1; 257/718; 257/719; 403/408.1; 24/453
[58] Field of Search ........................... 361/690, 694–697, 361/702–704, 707–710, 714–720; 165/80.2, 80.3, 185; 174/16.1, 16.3; 257/718, 719, 726, 727; 24/453, 297; 403/408.1; 267/150, 158, 160; 248/507, 509, 316.8

[56] References Cited

U.S. PATENT DOCUMENTS

| | | | |
|---|---|---|---|
| 4,566,660 | 1/1986 | Anscher et al. | 248/74.2 |
| 4,674,910 | 6/1987 | Hayashi | 403/408.1 |
| 4,920,618 | 5/1990 | Iguchi | 24/453 |
| 5,419,606 | 5/1995 | Hull et al. | 296/146.7 |
| 5,586,005 | 12/1996 | Cipolla et al. | 361/719 |
| 5,730,210 | 3/1998 | Kou | 165/80.3 |
| 5,883,783 | 3/1999 | Turturro | 361/704 |
| 5,901,039 | 5/1999 | Dehaine et al. | 361/704 |
| 5,943,210 | 8/1999 | Lee et al. | 361/697 |
| 5,947,191 | 9/1999 | Hiteshew et al. | 165/80.3 |
| 5,969,947 | 10/1999 | Johnson et al. | 361/704 |
| 5,973,399 | 10/1999 | Stark et al. | 257/731 |

*Primary Examiner*—Leo P. Picard
*Assistant Examiner*—Boris L. Chervinsky
*Attorney, Agent, or Firm*—Blakely, Sokoloff, Taylor & Zafman LLP

[57] ABSTRACT

A fastener for an electronic assembly. The fastener may have a spring arm that extends from a stem. The fastener can attach a cover to a heat sink of an electronic assembly. The stem may be inserted into a boss of the cover. The spring arm may exert a force onto the heat sink to press the sink into an integrated circuit package of the assembly.

11 Claims, 3 Drawing Sheets

HEAT SINK CLIP FOR AN ELECTRONIC ASSEMBLY

BACKGROUND OF THE INVENTION

1. Field of the Invention

The present invention relates to a fastener that can be used to attach a heat sink to a cover of an electronic assembly.

2. Background Information

Integrated circuits are typically assembled into packages that are soldered to a printed circuit board. The printed circuit board and integrated circuit package may be assembled into a cartridge that can be plugged into a motherboard of a computer. For example, Intel Corp., the assignee of the present application, has sold a cartridge commonly referred to as a single edge contact cartridge (SECC) that includes a heat sink and a cover that are coupled to a printed circuit board. The SECC may have a number of integrated circuit packages mounted to the printed circuit board and thermally coupled to the heat sink.

The heat sink is attached to the cover by a number of fasteners that extend through clearance holes in the printed circuit board. The fasteners are constructed to exert a spring force that push the heat sink into one of the integrated circuit packages. The integrated circuit package in contact with the heat sink contains a microprocessor that generates a relatively large amount of heat during operation. The spring force decreases the thermal impedance between the package and the heat sink.

The fasteners of the prior art are relatively expensive to produce and assemble into the SECC. It would be desirable to provide an electronic assembly fastener that can exert a spring force and is relatively inexpensive to both produce and assemble.

SUMMARY OF THE INVENTION

One embodiment of the present invention is a fastener for an electronic assembly. The fastener may have a spring arm that extends from a stem.

DETAILED DESCRIPTION

Figure 1:
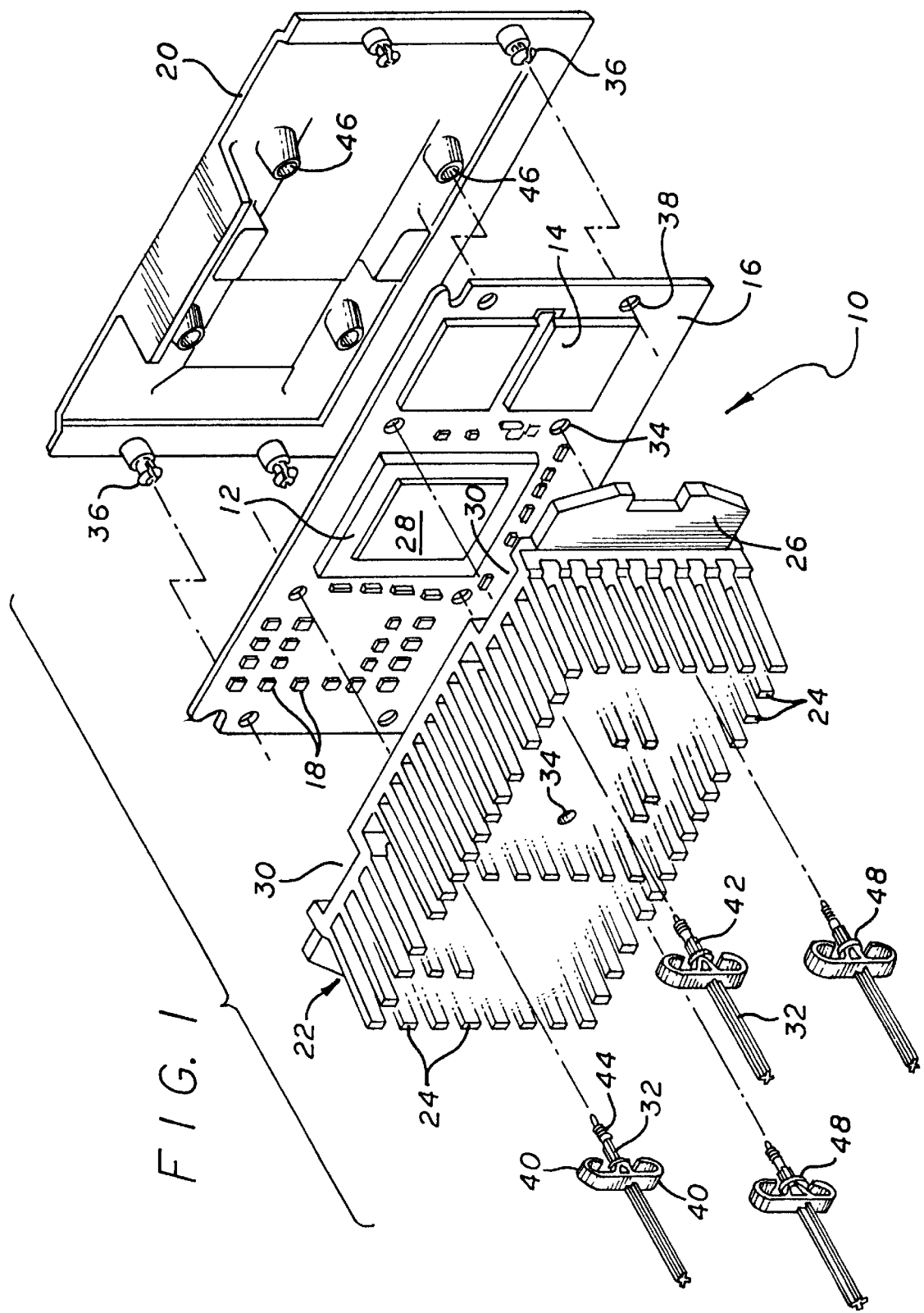
FIG. 1 is an exploded view showing an embodiment of an electronic assembly of the present invention.
Figure 2:
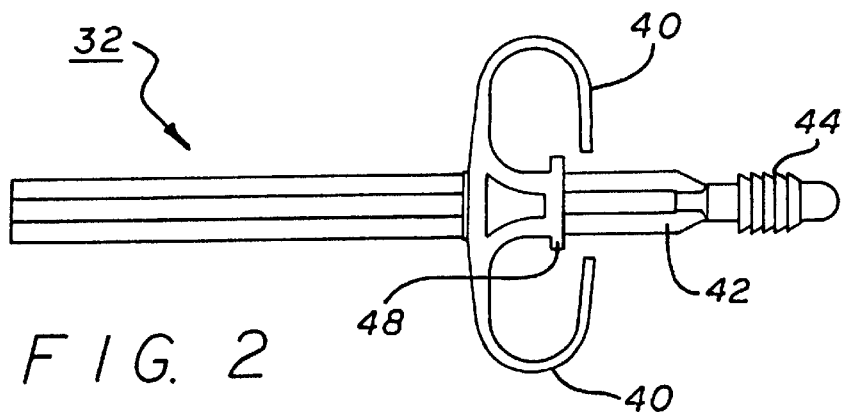
FIG. 2 is a side view of an embodiment of a fastener of the electronic assembly.

Referring to the drawings more particularly by reference numbers, FIGS. 1 and 2 show an embodiment of an electronic assembly 10 of the present invention. The assembly 10 may include integrated circuit packages 12 and 14 that are mounted to a printed circuit board 16. Each package 12 and 14 may contain one or more integrated circuits (not shown). By way of example, package 12 may contain a microprocessor. Packages 14 may contain static random access memory (SRAM) devices. The printed circuit board 16 may also contain passive elements 18 such as capacitors.

The assembly 10 may further have a cover 20 and a thermal element 22. The thermal element 22 may be a heat sink which has a plurality of fins 24 that extend from a pedestal 26. A portion of the pedestal 26 may be pressed into a lid 28 of the integrated circuit package 12. The heat sink 22 may have a pair of channels 30 that create air ducts when assembled onto the printed circuit board 16.

The assembly 10 may include a plurality of fasteners 32 that can be inserted through clearance holes 34 in the heat sink 22 and printed circuit board 16 and be attached to the cover 20. The clearance holes 34 may each have a diameter that is larger than the diameter of a fastener 32 to allow the heat sink 22 to "float" relative to the printed circuit board 16 and compensate for a difference in the coefficient of thermal expansion of the circuit board 16 and the sink 22. The assembly cover 20 may have a plurality of integral fasteners 36 that extend through corresponding holes 38 in the printed circuit board 16 and attach the cover 20 to the board 16.

Each fastener 32 may include a pair of spring arms 40 that extend from a stem 42. The stem 42 may have a barbed portion 44 that is inserted and embedded into a corresponding boss 46 of the cover 20. When the fasteners 32 are installed into the assembly 10, the spring arms 40 exert a spring force onto the heat sink 22. The spring force pushes the pedestal 26 into the integrated circuit package 12. Each fastener 32 may have a stop 48 that engages the heat sink 22 and limits the insertion depth of the stem 42 and the deflection of the spring arms 40. Each spring arm 40 may have a radial shape that is flexible enough to be deflected but stiff enough to exert a spring force onto the heat sink 22. The spring arms 40 also provide a keying feature that allows an operator or automated equipment to readily align the fasteners 32 into the assembly 10. Additionally, the spring arms 40 can provide a relatively uniform spring force onto the heat sink 22. Each fastener 32 can be constructed as an injection molded plastic part that is relatively inexpensive to produce.

Figure 3:
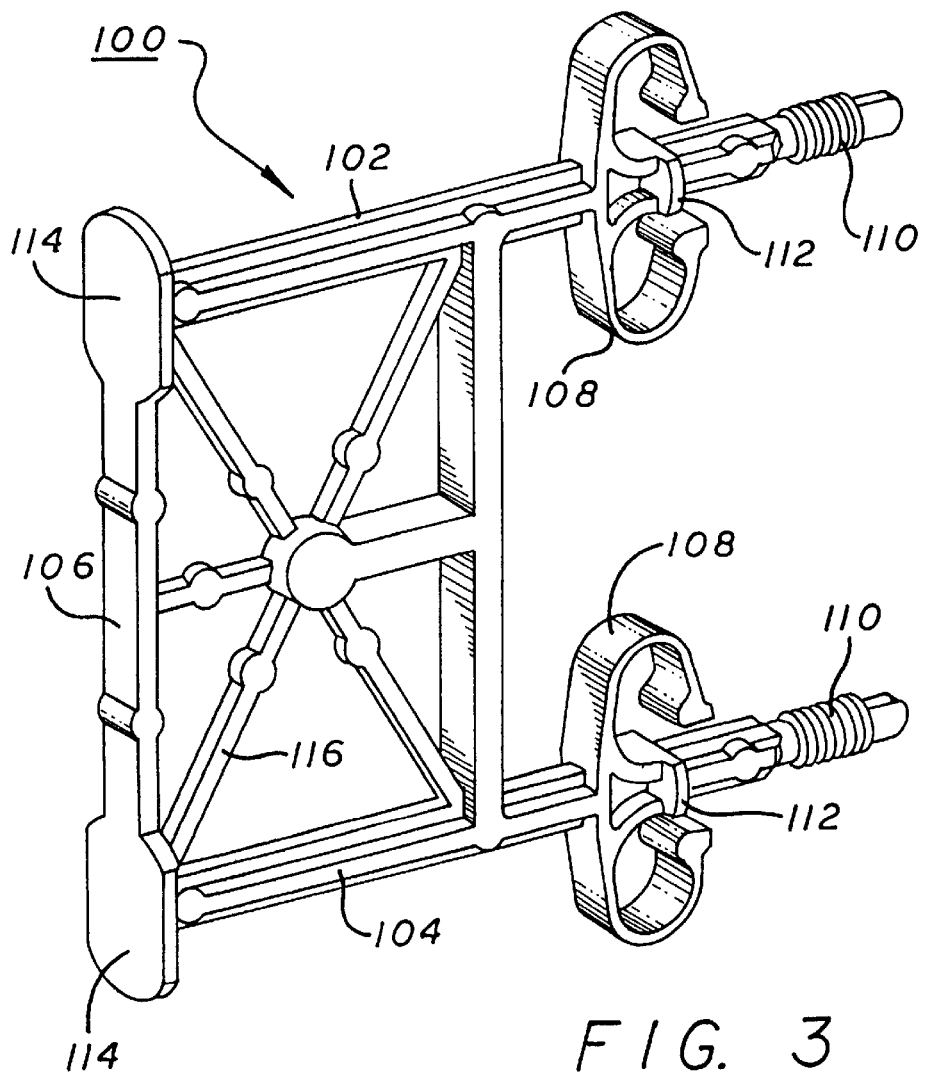
FIG. 3 is a perspective view of an alternate embodiment of the fastener.

FIG. 3 shows an alternate embodiment of a fastener 100 that has a first stem 102 attached to a second stem 104 by a connecting rod 106. Each stem 102 and 104 has a pair of spring arms 108, a barbed portion 110 and a stop 112. The connecting rod 106 may have a pair of head surfaces 114 that allow an operator or automated equipment to more readily insert the fastener 100 into an electronic assembly. The connecting rod 106 allows the stems 102 and 104 to be inserted into an electronic assembly at the same time, thereby further reducing the cost of assembling the fastener 100. The fastener 100 may have a truss structure 116 that provides structural support between the stems 102 and 104 while minimizing the fastener weight. The fastener 100 can be constructed as an injection molded plastic part.

Figure 4:
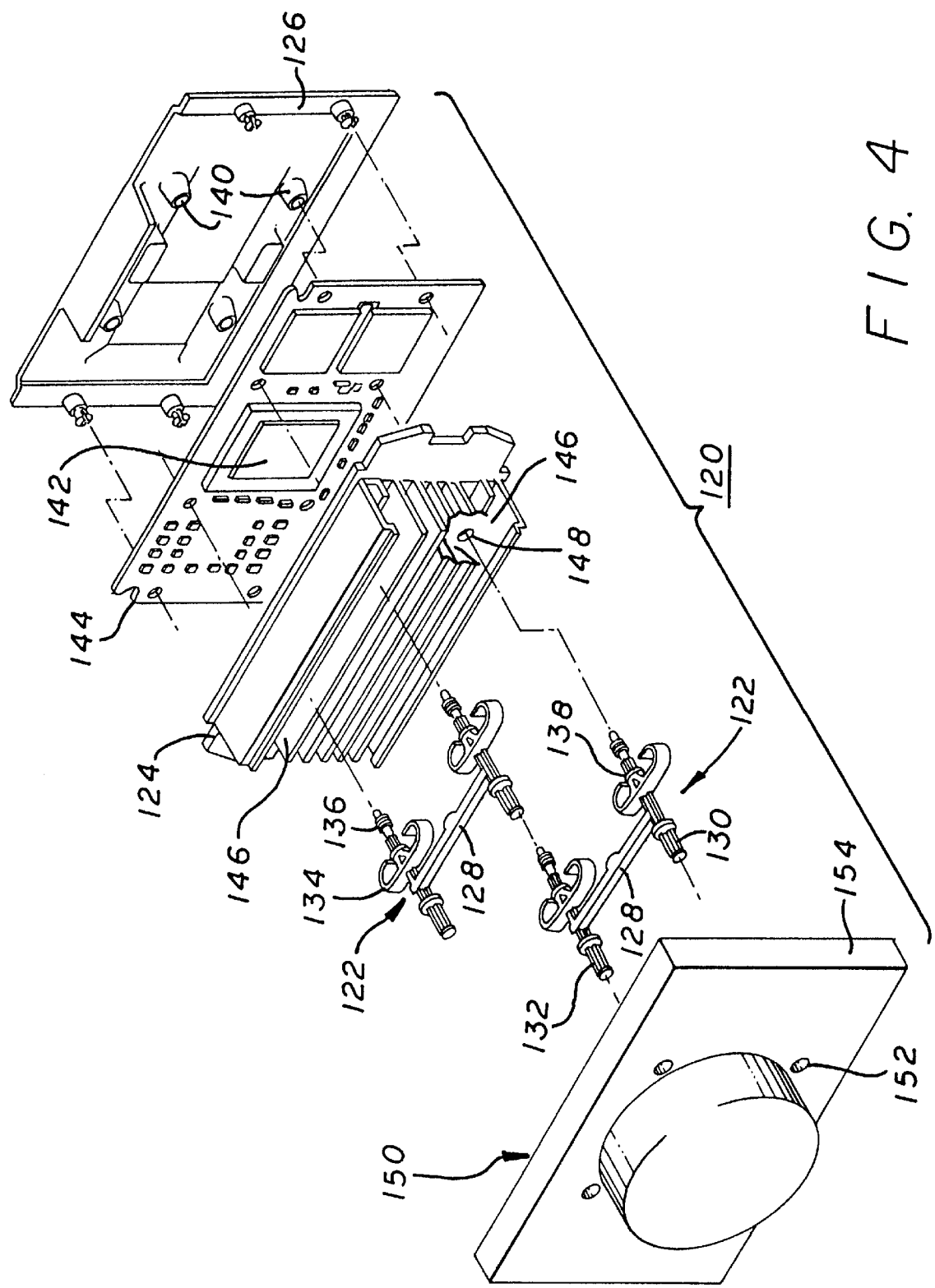
FIG. 4 is an exploded view of an alternate embodiment of an electronic assembly.

FIG. 4 shows an alternate embodiment of an electronic assembly 120 with a pair of fasteners 122 that can be used to attach a heat sink 124 to a cover 126. Each fastener 122 includes a connecting rod 128 that connects a first stem 130 to a second stem 132. Each stem 130 and 132 includes a pair of spring arms 134, a barbed portion 136 and a stop 138. The barbed portions 136 extend into and are embedded into corresponding bosses 140 of the cover 126. The spring arms 134 exert spring forces which push the heat sink 124 into an integrated circuit package 142 that is mounted to a printed circuit board 144. The fasteners 122 can be inserted into channels 146 of the heat sink 124 so that the stems 130 and 132 extend through corresponding clearance holes 148 in the sink 124 and printed circuit board 144.

The assembly 120 may include a fan assembly 150 that can be coupled to the heat sink 124. The stems 130 and 132 of each fastener 122 can extend through corresponding clearance holes 152 in the fan assembly 150 in a manner which allows an operator to install the fasteners 122 by pushing on the head of the fastener stems 130 and 132.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A fastener for an electronic assembly, comprising:
   a stem including a stop and a barbed portion; and,
   a spring arm that extends in a generally concave shape from said stem so that a portion of said spring arm extends over said stem between said barbed portion and said stop.

2. The fastener of claim 1, wherein said stem and said spring arm are constructed as an integrally molded plastic part.

3. A fastener for an electronic assembly, comprising:
   a first stem including a first end having a barbed portion, a stop, and a second end;
   a first spring arm having a portion that extends over said first stem between said barbed portion and said stop;
   a second stem including a first end having a barbed portion, a stop, and a second end;
   a second spring arm having a portion that extends over said second stem between said barbed portion and said stop; and,
   a connecting rod to connect said second end of said first stem to said second end of said second stem.

4. The fastener of claim 3, wherein said first spring arm extends in a generally concave shape from said first stem.

5. The fastener of claim 3, wherein said second spring arm extends in a generally concave shape from said second stem.

6. The fastener of claim 3, wherein said connecting rod includes a truss portion.

7. An electronic assembly, comprising:
   a cover;
   a thermal element;
   a substrate located between said cover and said thermal element;
   a fastener that attaches said cover to said thermal element, said fastener includes (i) a stem including a stop and a barbed portion, said stem attached to said cover; and (ii) a spring arm which extends in a generally concave shape from said stem so that a portion of said spring arm extends over said stem between said stop and said barbed portion, said spring arm exerts a force onto said thermal element.

8. The assembly of claim 7, wherein said barbed portion of said stem extends into a boss of said cover to attach said stem to said cover.

9. The assembly of claim 8, wherein said stop of said stem is in contact with said thermal element when said barbed portion of said stem is placed in said boss of said cover.

10. A method for assembling an electronic assembly, comprising:
    inserting a barbed portion at a first end of a stem of a fastener through a clearance hole of a thermal element; inserting the barbed portion of the stem through a clearance hole of a substrates; and inserting the barbed portion of the stem into a boss of a cover so that a spring arm of the fastener, arranged in a generally concave shape from the stem so that a potion of the spring arm extends over the stem between the barbed portion and a stop, exerts a force onto the thermal element.

11. A fastener for an electronic assembly, comprising:
    a stem including a stop and a barbed poxton; and,
    a spring arm that extends from said stem so that a portion of said spring arm extends over said stem between said barbed portion and said stop.

* * * * *

UNITED STATES PATENT AND TRADEMARK OFFICE
CERTIFICATE OF CORRECTION

PATENT NO.    : 6,101,096
DATED         : August 8, 2000
INVENTOR(S)   : MacGregor et al.

Page 1 of 1

It is certified that error appears in the above-identified patent and that said Letters Patent is hereby corrected as shown below:

Title page,
Item [75], delete "Tacomoa" and insert -- Tacoma --.

Column 4,
Line 32, delete "poxton" and insert -- portion --.

Signed and Sealed this

Seventh Day of May, 2002

Attest:

Attesting Officer

JAMES E. ROGAN
Director of the United States Patent and Trademark Office